United States Patent [19]
Taranowski et al.

[11] Patent Number: 5,889,660
[45] Date of Patent: Mar. 30, 1999

[54] ISOLATED POWER SUPPLY FOR INDICATOR LIGHT

[75] Inventors: Michael G. Taranowski, Milwaukee; Lawrence J. Ryczek, Waukesha; Steven C. Schmalz, Milwaukee, all of Wis.; Isaac Gruber, StaCecilia-Sao Paulo, Brazil

[73] Assignee: Eaton Corporation, Cleveland, Ohio

[21] Appl. No.: 812,463

[22] Filed: Mar. 6, 1997

(Under 37 CFR 1.47)

[51] Int. Cl.⁶ .......................... H02M 3/335; H02B 37/02
[52] U.S. Cl. .......................... 363/19; 315/219; 315/307
[58] Field of Search .................... 363/21, 18, 19, 363/20, 55, 56, 95, 131; 315/224, 225, 219, 277, 307

[56] References Cited

U.S. PATENT DOCUMENTS

| | | | |
|---|---|---|---|
| 3,939,398 | 2/1976 | Kellog | 324/21 |
| 4,346,432 | 8/1982 | Gurr | 363/129 |
| 4,647,830 | 3/1987 | Bees | 320/1 |
| 4,803,609 | 2/1989 | Gillett et al. | 363/17 |
| 5,130,608 | 7/1992 | Zahardis | 315/209 R |
| 5,252,891 | 10/1993 | Huang | 315/86 |
| 5,264,997 | 11/1993 | Hutchisson et al. | 362/226 |
| 5,353,001 | 10/1994 | Meinel et al. | 336/83 |
| 5,394,319 | 2/1995 | Attwood et al. | 363/20 |
| 5,404,082 | 4/1995 | Hernandez et al. | 315/219 |
| 5,430,424 | 7/1995 | Sato et al. | 336/200 |
| 5,559,395 | 9/1996 | Venkitasvbrahmanian et al. | 315/247 |
| 5,565,837 | 10/1996 | Godek et al. | 336/232 |
| 5,598,327 | 1/1997 | Somerville et al. | 363/131 |
| 5,604,411 | 2/1997 | Venkitasubrahmanian et al. | 315/307 |
| 5,650,694 | 7/1997 | Jayaraman et al. | 315/225 |
| 5,691,605 | 11/1997 | Xia et al. | 315/307 |

FOREIGN PATENT DOCUMENTS

| | | | |
|---|---|---|---|
| 2196805 | 5/1988 | United Kingdom | H05B 33/08 |
| 2239941 | 7/1991 | United Kingdom | F21S 9/92 |
| 2275141 | 8/1994 | United Kingdom | H05B 39/09 |
| 9109459 | 6/1991 | WIPO | H02M 3/337 |

OTHER PUBLICATIONS

Brochure titled "High Density>100W/in³ DC–to–DC Converters", Analog Devices, Inc., Feb. 1996, 4 pages and color photograph.

Data Sheet for Analog Devices ADDCO2805S dc–to–dc converter, © 1995 pp. 1–16.

*Primary Examiner*—Adolf Berhane
*Attorney, Agent, or Firm*—Larry G. Vande Zande

[57] ABSTRACT

A planar transformer having windings on a printed circuit board coupled by a high frequency ferrite core driven by a high frequency operational amplifier based relaxation oscillator controlling a switch for pulsing a primary winding of the transformer at a set frequency. The secondary of the transformer powers a lamp circuit which is isolated from the electrical supply, and a test input is connected in a logic OR arrangement with the electrical supply.

7 Claims, 2 Drawing Sheets

ISOLATED POWER SUPPLY FOR INDICATOR LIGHT

BACKGROUND OF THE INVENTION

This invention relates to indicator lights and particularly to power supplies for indicator lights. More particularly, the invention relates to a miniaturized isolated power supply for an indicator light.

Illuminated indicators, commonly referred to as indicator lights, are used in industrial control applications to signal the state of a remote piece of control apparatus. Indicator lights may be incorporated in pushbutton operated electrical switches. One or a few indicator lights may be located directly on an enclosure for electrical control apparatus or may be arranged in an array of indicator lights on a large control panel. The indicator light is connected to the power supply for the electrical control apparatus but contains its own power supply which commonly comprises a step-down transformer to provide reduced voltage for the light. Such power supplies typically use low frequency, bulky and heavy iron transformers, resulting in large, more expensive components and a need to dissipate significant power and heat. It is desirable to electrically isolate the light circuit at the secondary side of the transformer from the primary electrical supply. It is also desirable to provide a second input terminal to the indicator light for applying a test signal for the light. This second input necessitates the incorporation of a relay which increases the parts count and cost of the indicator light assembly.

SUMMARY OF THE INVENTION

This invention provides an isolated power supply for an indicator light comprising a high frequency circuit and high frequency transformer in a reduced size package for providing low power to a fixed load indicator light. The invention further provides for the incorporation of additional input terminals connected with the power input in a logic OR arrangement. The invention comprises a high-frequency op/amp relaxation oscillator driving a solid state switch to provide an inverter for driving a ferrite core planar transformer in an open loop fly-back approach to minimize size and cost of the components and minimize energy dissipation.

The invention, its features and advantages, will become more readily apparent when reading the following description and claims in conjunction with the appended drawings.

DETAILED DESCRIPTION OF THE PREFERRED EMBODIMENT

Figure 1:
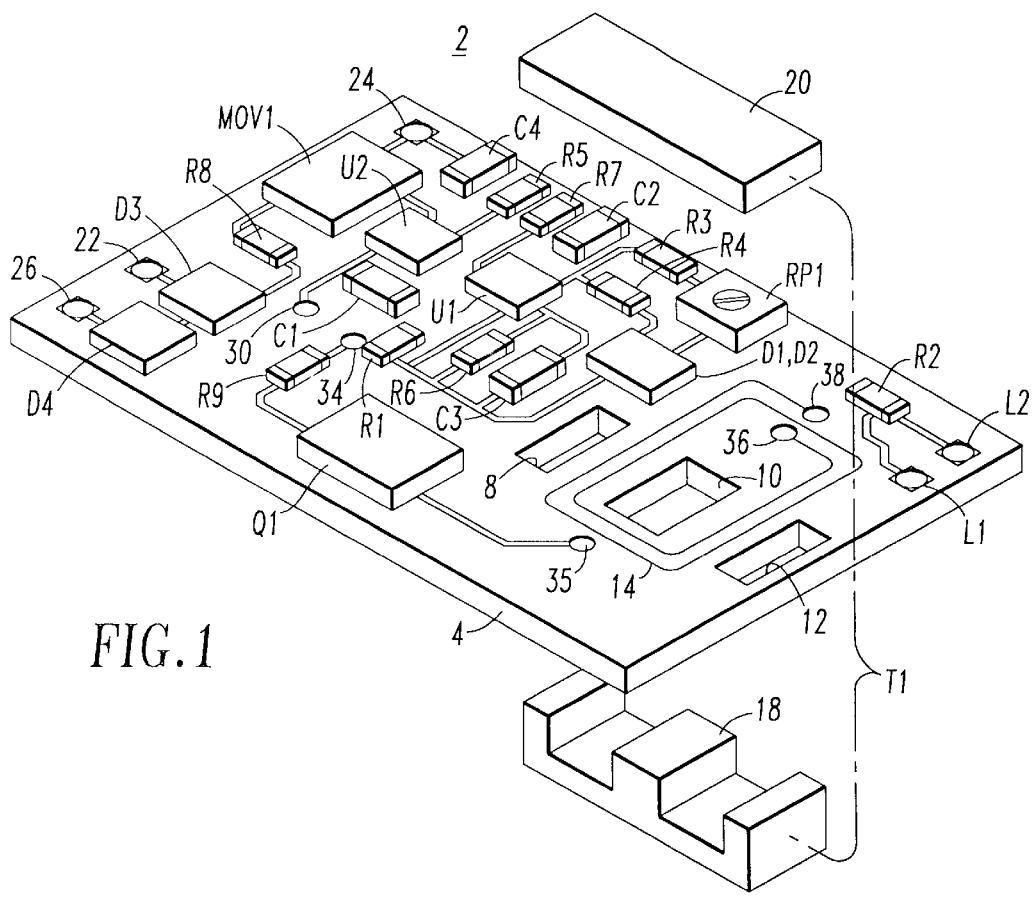
FIG. 1 is an axonometric view of the isolated power supply for an indicator light constructed in accordance with this invention, showing a ferrite core exploded from a printed circuit board.
Figure 2:
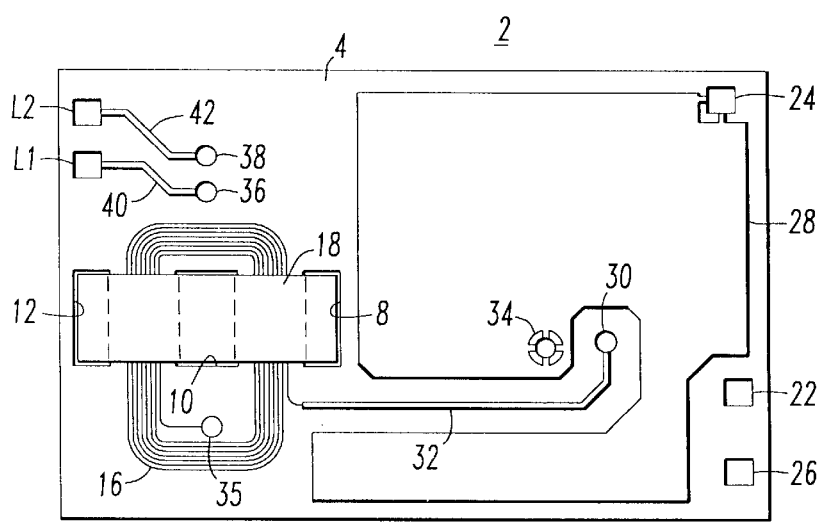
FIG. 2 is a bottom view of the isolated power supply of this invention shown in FIG. 1.

The isolated power supply 2 for an indicator light of this invention is embodied on a printed circuit board 4 as shown in FIG. 1. Printed circuit board (PCB) 4 comprises a conductive trace pattern to which the various electrical circuit components of this invention are attached, preferably by surface mount technology. PCB 4 comprises three aligned rectangular openings 8, 10 and 12. A first generally spiral conductive trace 14 is disposed on the top side of PCB 4 as viewed in FIG. 1, the winding 14 comprising a two turn secondary winding of a planar transformer T1. As seen in FIG. 2, an eight turn generally spiral conductive trace 16 is formed on the under side of PCB 4 around opening 10 to comprise a primary winding for the transformer T1. A ferrite E-core 18 and a ferrite top plate 20 are assembled to PCB 4 with the legs of E-core 18 extending through openings 8, 10 and 12 to the upper surface of PCB 4 where top plate 20 is attached to the upper faces of the legs by an adhesive or the like. E-core 18 and top plate 20 are commercially available items from Philips with core material 3F4 which provides for a high frequency with relatively low core losses. The ferrite core constrains the magnetic field in a closed path to reduce noise. Transformer T1 is designed to a 4:1 turns ratio to provide the desired performance and less current per pulse. Eight turns represents the maximum number of turns practical in the space available between openings 8–10 and 10–12, to maintain a functional over surface distance between the individual windings and between the windings and the respective legs of E-core 18. If a greater number of turns are required, PCB 4 may alternatively be constructed as a layered board with intermediate layers having additional spiral traces around the center opening 10. Terminations of the alternate windings may be brought out through and to the top layer of the board to the upper surface. Thus by appropriate connections at the top surface, the primary and/or secondary can have additional windings as required for the particular power source to maintain the 4:1 turns ratio.

Figure 3:
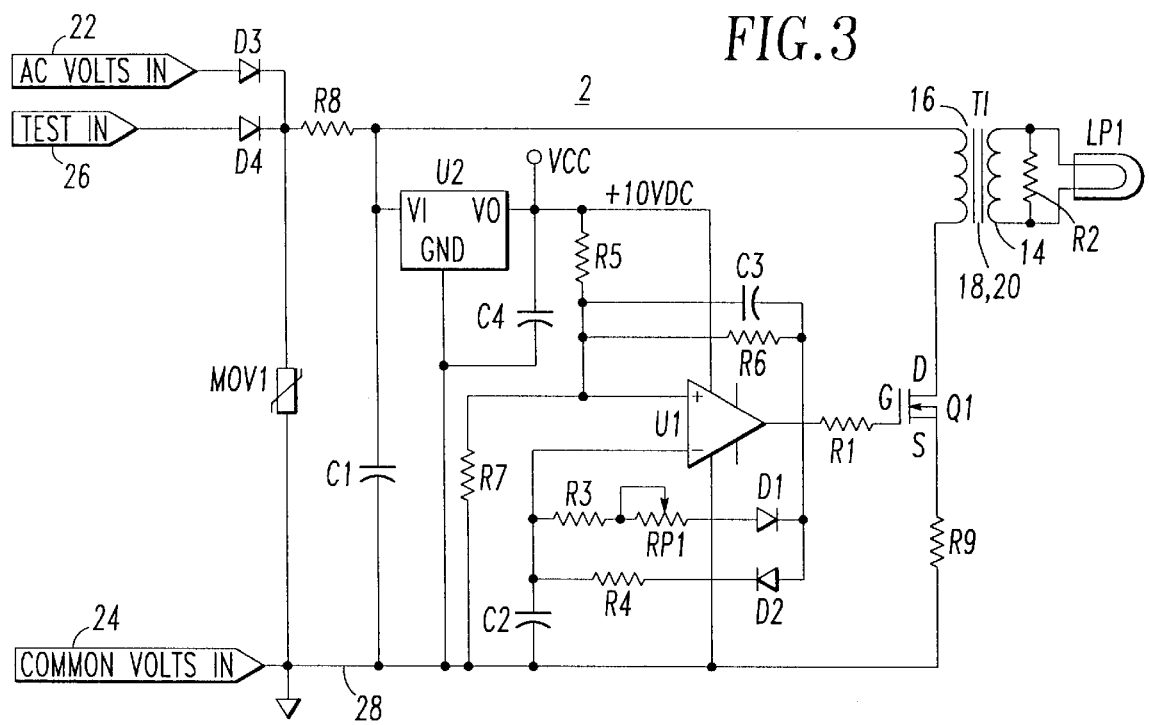
FIG. 3 is a schematic diagram of the isolated power supply of this invention.

Referring particularly to the circuit diagram of FIG. 3, the isolated power supply for an indicator light of this invention comprises power input terminals 22 and 24 which are connectable to an external AC source of power. A third input terminal 26 is provided, connected in a logic OR arrangement with input terminal 22, to provide a test input terminal which may be connected to a separate test pushbutton or the like for testing one or more of the indicator light circuits. To prevent the AC supply or the test signal from being backfed into the opposite input, diodes D3 and D4 are connected in line with the respective input terminals 22 and 26 to block current from one supply terminal from flowing into the opposite supply terminal. A resistor R8 and capacitor C1 provide a filter for the circuit, the junction of these two elements being connected to one side of primary winding 16 of transformer T1 by a plated through hole 30 (FIGS. 1 and 2) and a conductive trace 32 (FIG. 2) on the bottom of PCB 4. The opposite side of capacitor C1 is connected to the grounded common conductor 28 by a plated through hole 34. The RC circuit of R8 and C1 also decouple the circuit of this invention from switching transients which occur at the transformer T1. A metal oxide varistor MOV1 is connected across the AC supply to protect the power supply from line surges. The opposite end of primary winding 16 is connected to the drain terminal of a FET Q1 by a plated through hole 35.

A linear regulator U2 such as an LR645 has its input terminal VI connected to the common junction of resistor R8 and capacitor C1 and a ground terminal GND connected to the common conductor 28. Linear regulator U2 provides a low voltage DC, e.g. 10 volts DC, at its output terminal VO. In a preferred embodiment the linear regulator is an LR645N8 available from Supertex Inc. of Sunnyvale, Calif.

A filter capacitor C4 is connected across the output terminal VO and the common conductor 28.

A high frequency operational amplifier based relaxation oscillator is connected to the linear output VO of linear regulator U2. An LM6171 operational amplifier U1 is utilized in the oscillator circuit. The junction of three equal value resistors R5, R6 and R7 is connected to the non-inverting terminal 3. Resistors R5 and R7 are connected in series between linear regulator output VO and common conductor 28. Resistor R6 is connected between the output terminal 6 and non-inverting input terminal 3 of operational amplifier U1, in parallel with a speed-up capacitor C3 which provides lead capacitance to the system, decreasing the oscillator switching time. A capacitor C2 is connected between the inverting terminal 2 of operational amplifier U1 and common conductor 28. Parallel resistance paths are connected between the output terminal 6 and input terminal 2 of the operational amplifier U1 to provide separate RC circuits with capacitor C2. A first path includes resistor R4 which is in series with a diode D2 poled in a forward direction to capacitor C2. The second path comprises resistor R3 and a variable resistor RP1 in series with a diode D1 poled in a blocking direction from operational amplifier output terminal 6. This circuit provides an open loop high frequency oscillator, the frequency of which is set by the ratio of the resistances in the two paths, as will be described hereinafter. Referring to FIG. 1, diodes D1 and D2 are in a common, dual diode, series connection package.

The output terminal 6 of operational amplifier U1 is connected to one side of a resistor R1 which is connected to the gate of a FET Q1. The source and drain of Q1 are connected in series with primary winding 16 of transformer T1 between the input power supply conductor and common conductor 28. A resistor R9 is connected in series with the source of FET Q1 and the common conductor 28 to raise the ON threshold of FET Q1 to increase the turn off switching speed of the FET.

A fixed load light circuit is connected to the secondary winding 14 as shown in FIG. 3. Referring to FIGS. 1 and 2, the ends of secondary winding 14 are connected to through holes 36 and 38. At the bottom side of PCB 4, holes 36 and 38 connect to lamp terminals L1 and L2 by conductive traces 40 and 42. This circuit comprises a lamp LP1 which preferably is an incandescent lamp, but could be another type of light source such as a light emitting diode or the like, connected to the terminals L1 and L2. A resistor R2 is connected in parallel with the lamp across terminals L1 and L2 at the top surface of PCB 4. The lamp circuit is completely isolated from the primary electrical power by the transformer T1.

Figure 4:
FIGS. 4, 5, 6 and 7 are graphical representations of voltages appearing at different points in the circuit shown in FIG. 3.
Figure 5:
Figure 6:

Although not shown herein, the isolated power supply 2 for an indicator light of this invention is disposed in an indicator light housing adapted to be mounted through an opening in a panel. The input terminals 22 and 24 are connected to an AC power supply for the panel. When so connected, the AC input power such as 120 volts is rectified by diode D3 to supply half wave rectified AC (FIG. 4) to one side of the primary winding 16 of transformer T1 and to the input VI of linear regulator U2. Regulator U2 reduces the voltage and supplies pulsed 10 volt DC (FIG. 5) at output terminal VO thereof Approximately $2/3$ of the regulated voltage appears at the junction of resistors R5, R6 and R7 and is applied to the non-inverting terminal 3 of operational amplifier U1. When the voltage at terminal 3 is greater than that appearing at terminal 2 the output 6 of operational amplifier U1 goes high, applying a positive signal to the gate of FET Q1, turning FET Q1 on and conducting current from the half wave rectified AC power through primary winding 16 of transformer T1. The output of operational amplifier U1 is also applied through diode D2 and resistor R4 to capacitor C2, charging that capacitor. The values of R4 and C2 are selected to rapidly increase the voltage to inverting terminal 2 of operational amplifier U1 to greater than $2/3$ the regulated voltage applied at non-inverting terminal 3, thereby causing output 6 of operational amplifier U1 to go low, turning off the FET Q1 and interrupting current to winding 16 of transformer T1. Thus R4–C2 determine the width of the ON time pulse of the output at operational amplifier U1, and therefore the ON time of FET Q1. The duration of the ON pulse is particularly selected to be short to prevent saturation of the core. This pulse signal remains constant. The OFF time is set by variable resistor RP1 which permits the discharging of capacitor C2 down to $1/3$ the regulated voltage level to again cause the output 6 of operational amplifier U1 to go high. Accordingly, a series of pulses (FIG. 6) is supplied to the gate of FET Q1, during the period when regulator U2 is producing a positive voltage output at a frequency equal to that of the oscillator and as set by variable resistor RP1, causing FET Q1 to turn ON and OFF at that frequency which in turn supplies pulses of half wave rectified AC to transformer T1 primary winding 16. Such open loop circuit continues to oscillate at the set frequency.

Figure 7:
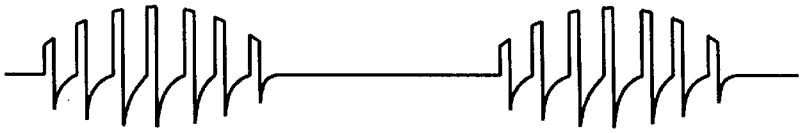

The pulses supplied to transformer T1 appear at the secondary winding 14 to energize lamp LP1. As seen in FIG. 7, energy stored in the core 18, 20 is discharged into secondary winding 14 to decrease the energy in the core to zero at each pulse (FIG. 7), also preventing saturation of the core.

The foregoing has described an isolated power supply for an indicator light which is capable of miniaturization to fit into a housing of an industrial indicator light, has a minimal number of components which are of small size, and is economical. The combination of a high frequency planar transformer driven by a high frequency oscillator and inverter reduces power consumption and size, while permitting a test input in a logic OR arrangement with an external power source. Although the invention has been disclosed in a preferred embodiment, it is to be recognized that it is susceptible of various modifications and alternate embodiments without departing from the scope of the appended claims.

We claim:

1. An isolated open loop power supply for an indicator light comprising:
   a planar transformer comprising:
      a printed circuit board;
      a primary winding comprising a first conductive trace on said board;
      a secondary winding comprising a second conductive trace on said board isolated from said first conductive trace; and
      a ferrite core assembled to said printed circuit board coupling said primary and said secondary windings;
   an indicator light connected to said secondary winding;
   solid state switch means;
   a source of electrical power connected to said primary winding through said solid state switch means; and
   a high frequency oscillator on said printed circuit board connected to said source and being operable for operating said solid state switch means for supplying energizing pulses to said primary winding.

2. The invention defined in claim 1 wherein said oscillator provides a pulse width modulated output adjusted by a single one-time potentiometric setting.

3. The invention defined in claim 1 wherein said energizing pulses do not saturate said core, and said core discharges to zero through said secondary winding between successive pulses.

4. The invention defined in claim 1 wherein said high frequency oscillator is a wide band operational amplifier based relaxation oscillator.

5. The invention defined in claim 1 wherein said source of electrical power is AC and further comprising rectifier means for rectifying said source of electrical power.

6. The invention defined in claim 5 comprising auxiliary input means connected as a logic OR with said source of electrical power.

7. The invention defined in claim 6 further comprising linear regulator means for providing reduced voltage DC pulses.

* * * * *